(12) United States Patent
Wang (10) Patent No.: US 9,768,334 B2
(45) Date of Patent: Sep. 19, 2017

(54) HIGH EFFICIENCY SOLAR CELLS WITH QUANTUM DOTS FOR IR PUMPING

(71) Applicant: Chia-Gee Wang, New York, NY (US)

(72) Inventor: Chia-Gee Wang, New York, NY (US)

(*) Notice: Subject to any disclaimer, the term of this patent is extended or adjusted under 35 U.S.C. 154(b) by 0 days.

(21) Appl. No.: 14/676,183

(22) Filed: Apr. 1, 2015

(65) Prior Publication Data

US 2016/0013339 A1    Jan. 14, 2016

Related U.S. Application Data

(63) Continuation-in-part of application No. PCT/US2013/063018, filed on Oct. 2, 2013.

(60) Provisional application No. 61/708,807, filed on Oct. 2, 2012, provisional application No. 61/779,027, filed on Mar. 13, 2013.

(51) Int. Cl.

| | | |
|---|---|---|
| *H01L 31/00* | (2006.01) | |
| *H01L 31/0352* | (2006.01) | |
| *H01L 31/072* | (2012.01) | |
| *H01L 31/074* | (2012.01) | |
| *H01L 31/18* | (2006.01) | |

(52) U.S. Cl.
CPC .... *H01L 31/035218* (2013.01); *H01L 31/072* (2013.01); *H01L 31/074* (2013.01); *H01L 31/18* (2013.01); *H01L 31/1804* (2013.01); *H01L 31/1864* (2013.01); *Y02E 10/547* (2013.01); *Y02P 70/521* (2015.11)

(58) Field of Classification Search
CPC ........... H01L 31/035218; H01L 31/072; H01L 31/18; H01L 31/1804; H01L 31/1864; H01L 31/074; Y02E 10/547; Y02P 70/521

USPC .......................................................... 136/261
See application file for complete search history.

(56) References Cited

U.S. PATENT DOCUMENTS

| | | | |
|---|---|---|---|
| 2,132,360 A | 10/1938 | Merchant | |
| 4,323,419 A | 4/1982 | Wakefield | |
| 5,024,706 A | 6/1991 | Kanai et al. | |
| 5,693,961 A | 12/1997 | Hamada | |
| 8,158,880 B1 * | 4/2012 | Girt ........................ | B82Y 20/00 136/255 |

(Continued)

FOREIGN PATENT DOCUMENTS

| | | |
|---|---|---|
| EP | 0 111 394 A2 | 6/1984 |
| WO | 2008/109133 A1 | 9/2008 |

(Continued)

*Primary Examiner* — Tamir Ayad
(74) *Attorney, Agent, or Firm* — Ladas & Parry LLP (57) ABSTRACT

A photovoltaic (PV) device including: (a) a p-n junction having (i) p-type silicon substrate with an Al-doped P++ surface, (ii) a wide band intrinsic AlP region having a first side formed on the Al-doped P++ surface of the silicon substrate, and (iii) an Si-doped n++ surface formed on a second side of the AlP region that is opposite to the first side; (b) charged quantum dots formed on the Si-doped n++ surface of the p-n junction and optionally (c) an electrode connected to each side of the device; wherein the charged quantum dots are operatively linked to the p-n junction to enable electrons harvested from IR photons absorbed by the quantum dots to be harvested with electrons harvested from photons absorbed by the p-n junction and wherein the wide band intrinsic AlP region is configured to inhibit leakage of hole current. Also, a method for forming the PV device.

1 Claim, 7 Drawing Sheets (56) References Cited

U.S. PATENT DOCUMENTS

2010/0288189 A1  11/2010  Cohen et al.

FOREIGN PATENT DOCUMENTS

WO    2009/029902 A1    3/2009
WO    2012/009808 A1    1/2012

* cited by examiner

HIGH EFFICIENCY SOLAR CELLS WITH QUANTUM DOTS FOR IR PUMPING

CROSS REFERENCE APPLICATIONS

This is a continuation-in-part of International Application of PCT/US2013/063018 filed on 2 Oct. 2013, which designated the U.S., which claims the benefit of priority of U.S. Patent Applications No. 61/708,807 filed 2 Oct. 2012 and 61/779,027 filed 13 Mar. 2013, which are incorporated herein by reference.

FIELD OF THE INVENTION

This application pertains to methods for the low cost fabrication of high efficiency solar cells and to high efficiency solar cells prepared by such methods.

BACKGROUND OF THE INVENTION

Recently, there have been major advances in the efficiency of photovoltaic (PV) devices. For example, using the basic GaAs material plus some replacement element like Indium, Spectrum Labs (now a division of Boeing) has reached a world record efficiency of ½ of the theoretical limit of infinite layers at 87% [2] with concentrator, and approximately 30% without concentrator using the triple junction structure. Such a PV device, however, is notoriously difficult to fabricate and form an integrated unit where the same current would flow over layer by layer without waste and with photons being collected in their designated regions. To improve on the silicon PV efficiency at 21-22% in order to reach the triple junction level at 30%, the difference in price per Watt could imply a price change of $10^4$, therefore only the specialty application such as for space, for example, would engage the far more costly triple junction solar cells. Note that using n-Si wafers, MidAmerican SunPower could reach an efficiency of nearly 24% [10] at a much reduced price.

The recent announcement of using PbSe nanocrystal with the biological molecule pentacene to harvest the solar radiation with the triplet excitons from a group at Cambridge University [1] that has reached an efficiency of 95% is astonishing. Although the use of biological molecules is beyond this solicitation, it does involve compound semiconductors in nanocrystal, an area beyond the CQD's current investigation and we will watch its development to see if the triplet state energy could be collected in the singlet ground.

The efficiency of recent flexible colloidal PV cell with QD at 8-10% [2] seems to have been surpassed by the equally recent, flexible perovskite PV cells at twice the efficiency [11]. They do not, however reach the proposed CQD on the simple AlP/Si heterojunction solar cell that could have ~40% efficiency with even lower unit fabrication cost and unit facility cost.

Reviewing some recent new developments, the triplet exciton approach using the biochemical molecule pentacene by the Cambridge group has claimed an astonishing quantum efficiency of 95% [1], which is higher than the theoretical limit of an infinite number of multijunction layers following exactly the solar radiation spectrum with ideal thermal management at 87% [2], and the IBM/Canadian Universities' PV approach of using a flexible substrate coated with black nano particles at 8% efficiency [3]. These new developments offer certain new perspectives and possibilities. There is a question, however, for the triplet exciton model, once the "device" is connected with electrodes to collect the photoelectrons, would the $E_F$ force the triplet electrons to return to the singlet ground state? Also for the flexible substrate coated with black nano particles, it seems that the system will be such a perfect heat sink for sunshine, that it could instead be more useful for thermal electric power generation, also using quantum dots, and deliver 30% power efficiency with appropriate insulation in order to reach the needed 600° C.

Using a solar constant of 1,366 Watts/m² at AMO, each km² of area facing the sun receives solar radiation energy equal to a mid-sized nuclear power plant. For space born vehicles with high launching cost, the most desired parameters for solar cells include low specific weight, high photovoltaic (PV) efficiency, high durability in the space environment and high tolerance to radiation, as well as a relatively low fabrication cost. Nearly all these demanding parameters can be met by heterojunction solar cells enhanced by charged quantum dots (CQD) to be manufactured at a low fabrication cost as described hereinafter.

At an anticipated 40% PV efficiency, and achieving it at low cost for realistic implementation can benefit not only space-borne vehicles and unmanned air vehicles (UAV), but also low cost terrestrial applications. In fact, compared to triple junction PV cells reaching the world record efficiency with concentrator and a space device at ~30%, it is contemplated that the device described herein may be able to surpass that record efficiency without concentrator and achieve it at a cost reduction of many orders of magnitude. From space-borne units to UAV to low cost commercial roof-top installations, there is a large range of potential applications and the high throughput fabrication scheme is so inexpensive that it can dramatically reduce the capital requirements to accelerate the development of these applications.

SUMMARY OF THE INVENTION

Solar cell technologies under current practice can be considered in four areas; the thin film semiconductor, the silicon-based devices, the multijunction devices, and the more recent, charged quantum dots (CQD). The first three areas are related to the semiconductor material bandgap, and the CQD can add to the three by using solar IR photons to pump up the occupied electron states in a confined space linked by conductive semiconductor surface where the IR photoelectrons are forced into the degenerate system to result with harvested electron chargers as indicated in FIG. 4B. Such a CQD can deliver a much enhanced high efficiency without much additional costs in material and fabrication facilities.

Quantum dots (QD) can be formed when a thin film with material A couples to substrate material B with low coupling affinity between A and B. This allows the atomic attractions of A to coalesce under annealing, and form QD on the B substrate surface. Since small dots have a very large ratio of surface over volume, with surface atoms having un-saturated bonds, the CQD can exhibit many unusual quantum mechanical characteristics not found in macro solid state, such as the IR photon pumping in a quantized charged system. As the CQD are intrinsically charged with occupied electron energy states, when a low energy photo electron is forced into the charged system, it can raise top occupied energies in the system and allow them to move to the top level to be collected as the PV solar cell electrons. The Si-QD cannot be built on a silicon substrate as the deposition of silicon would simply make the substrate thicker upon annealing, but using a III-V compound as substrate having high binding energy (AlP melting point is 2,500° C.), the deposition of ultra-thin layer of silicon can be annealed to coalesce and form the CQD. CQD pumping can double the PV efficiency of certain materials, provided the hole current is balanced in the PV cell design, as considered in the charged $p^{++}$ layer surface.

In accordance with the invention, there is provided a single stage pn-junction solar cell that does not need to use lattice matched material selections, nor current matched multi-junction designs. The solar cell is based on the PV concept with sound physical principles described herein that enables low cost fabrication and high efficiency performance.

The solar cell can be modified from low cost silicon solar cells by replacing the conventional phosphorous doped n-region with a low cost wide band III-V compound of intrinsic aluminum phosphide (i-AlP) annealed on the p-Si substrate with $p^{++}$ surface and implanted with $n^{++}$ Si-dopant in the i-AlP to support charged quantum dots (CQD) and form a conductive substrate surface of $n^{++}$-AlP. In accordance with a preferred embodiment of the invention, the solar cell satisfies the following parameters.

The wide band n-region of i-AlP dramatically reduces the hole leakages and drives the voltage output $V_{max}$ at optimal power close to the open circuit voltage $V_{oc}$.

The CQD built on a conductive $n^{++}$ surface forms a quantized system to absorb IR photoelectrons, drive them into the system and force top electron energy to join the free energy state $E_F$ to be collected at a level beyond the $J_{sc}$ current level without degrading the $V_{max}$.

The stable i-AlP sandwiched between $p^{++}$ and $n^{++}$ surfaces separates these two regions so that photoelectrons created by IR pumping can readily be collected with very high collection efficiency, allowing $p^{++}$ to drive the hole current effectively.

The PV efficiency gain is combined from $V_{max} \sim V_{oc}$ and from the CQD pumping from IR to result with $J_{max} \gg J_{sc}$ (conventional).

In accordance with another embodiment of the invention, a low cost manufacturing process is provided to fabricate the solar cell. It uses a fast, continuous fabrication process, including the relatively slow but necessary annealing and cooling procedures without involving any high cost material and equipment.

DETAILED DESCRIPTION

In accordance with one embodiment of the invention, there is provided a simple heterojunction design that starts with a monocrystalline p-Si wafer at, for example, 40 µ thick. The wafer surface is then covered with an inexpensive Al foil at, for example, 4 µ thick. The Al/Si can then be heated to, for example, 300° C. in an oxygen-free oven with phosphorous vapor (from, e.g., red phosphorous powder) to form a self-limiting III-V wide band AlP compound that is stable up to 2,500° C. This can be followed by an annealing stage of up to 900° C. to melt the remaining Al and allow it to become the $p^{++}$ dopant on the p-Si substrate surface beneath the i-AlP. This surface is useful to subsequently receive the $n^{++}$ Si as the shallow implanted dopant. Next, silicon-based CQD can be formed on the $n^{++}$ surface and organized into a quantized system that absorbs incoming IR photons and pumps the IR photoelectrons into the quantized CQD assembly to raise the charges into the $E_F$ level where they are collected by the digital n-electrodes, while the remaining i-AlP separates the $n^{++}$ and $p^{++}$ surfaces to prevent tunneling shorts while allowing the highly charged surfaces to drive the PV currents.

Figure 1:
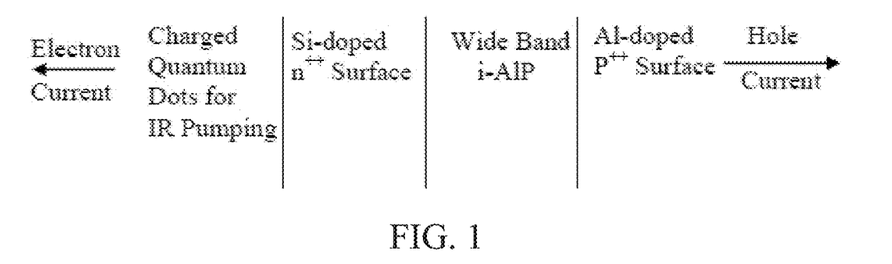
FIG. 1 is a PV cell design with high quantum efficiency in accordance with one embodiment of the invention.

The result is a pair of highly charged surfaces separated by an intrinsic wide band i-AlP, with charged QD constructed on $n^{++}$ substrate surface assisted by IR pumping to harvest electron current and $p^{++}$ surface blocked by a wide band n region for optimal diffusion-limited hole current without reducing much the voltage $V_{max} \sim V_{oc}$, as indicated in FIG. 1.

Figure 2A:
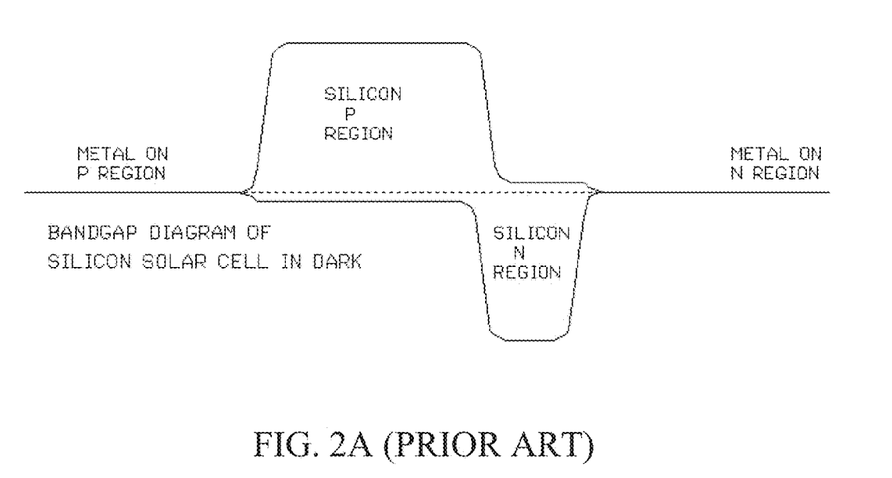
FIGS. 2A and 2B show a conventional PV cell in dark (FIG. 2A) and in light (FIG. 2B).
Figure 2B:
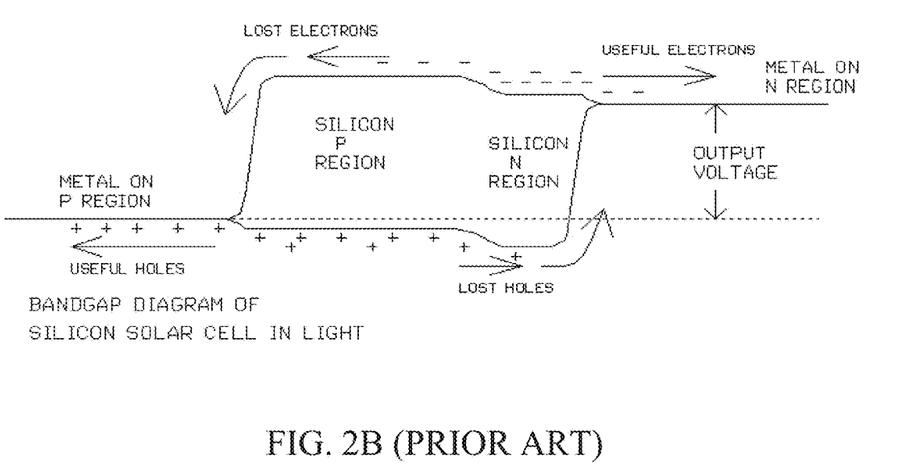
Figure 3:
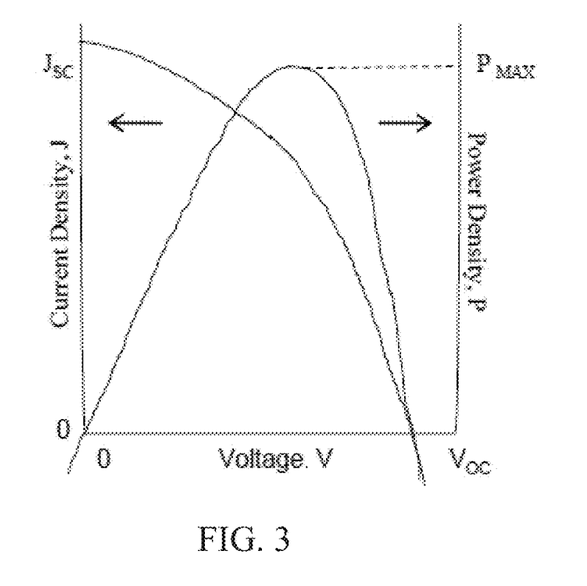
FIG. 3 shows the relationship between the current output J and the voltage output V.

In a conventional pn solar cell (FIG. 2A in dark and FIG. 2B in light), the maximum power output could be derived by having the voltage $V_{max}$ setting at approximately 70% of open circuit voltage $V_{oc}$ and the current $J_{max}$ at almost the short circuit current $J_{sc}$. In FIGS. 2A and B, the pn junction can either be silicon or III-V wide band. The hole current must balance the electron current, and leakages of hole current from the diffusion-limited collection restricts the $V_{max}$ to ~70% of $V_{oc}$. As shown in FIG. 3, for solar cell output power, whether using the narrow bandgap materials Si or Ge, or the wide bandgap III-V compound, in single or multi-junctions, the maximum current output $J_{max}$ could be made close to that of short circuit $J_{sc}$, but the voltage output for maximum power $V_{max}$ is only ~70% of the open circuit voltage $V_{oc}$ due mainly to the diffusion-limited hole leakages, as shown in FIG. 2B. By blocking the leakages with a heterojunction wide bandgap n-region, the hole leakages can be reduced as shown in FIG. 4B, and bringing $V_{max}$ closer to $V_{oc}$, and therefore increasing $V_{max}$ the power output by ~40%. As indicated in FIG. 2B, the hole leakage over the diffusive p-substrate is mainly responsible for the reduction of $V_{max}$ by ~30% from $V_{oc}$ (FIG. 3).

Figure 4A:
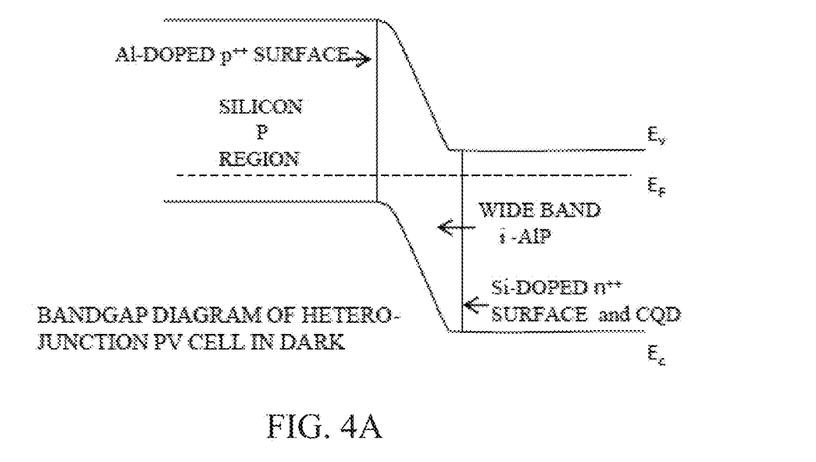
FIGS. 4A and 4B show a heterojunction p-i-n PV cell according to the invention in dark (FIG. 4A) and light (FIG. 4B).
Figure 4B:
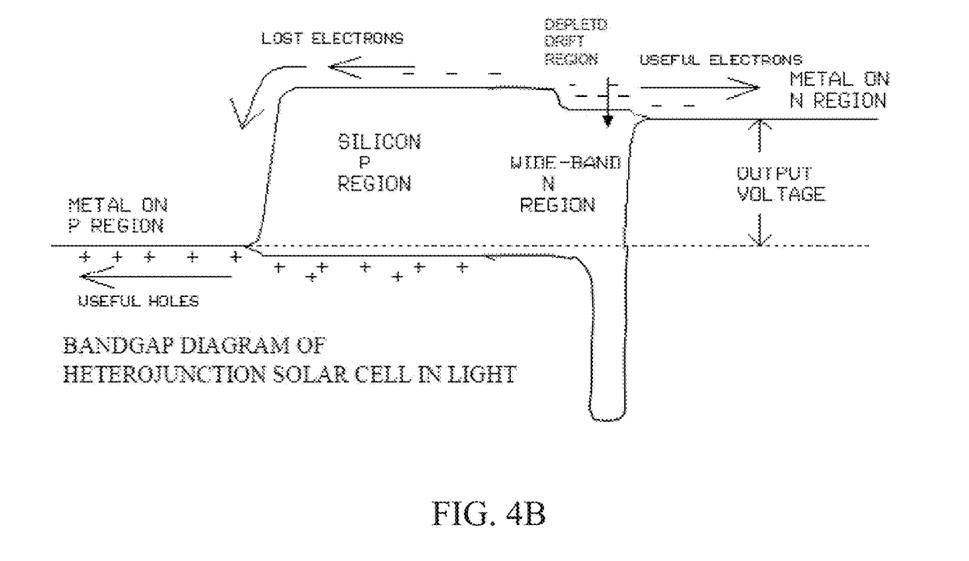

FIG. 4A shows a heterojunction p-i-n PV cell according to the invention in dark. A boron-doped p-Si substrate may be covered with a 4 µAl foil, forming i-AlP in over 300° C. in an oxygen-free oven with phosphorous vapor. The remaining Al merges into the p-Si as the dopant for $p^{++}$ surface at T≥660° C. Implanting Si on i-AlP to form $n^{++}$ surface supports the formation of CQD. They will form CQD on a conductive Si-doped $n^{++}$-AlP surface.

FIG. 4B shows the heterojunction p-i-n PV cell according to the invention in light. The highly charged surfaces $n^{++}$ and $p^{++}$ separated by i-AlP between $p^{++}$ (Al-dopant) and $n^{++}$ (Si-doped $n^{++}$ and CQD) surfaces to deliver a PV power different from the diffusion-limited hole harvesting. The wide band n-region largely blocks the hole leakages and brings $V_{max}$ close to $V_{oc}$.

In the intrinsic i-AlP region sandwiched between p++ Si-surface formed by the Al-dopant having a limited diffusion penetration in the Si matrix that originated from the remaining Al film at T≥660° C. not involved from the self-limiting formation of i-AlP, whose n-region will be shallowly implanted with Si as n++ dopant to form an n++ surface. Additionally, the CQD will be formed by the deposition of n+ Si on the conductive n++ i-AlP substrate surface and annealed in order to self-assemble into the n+ CQD on the conductive n++-AlP surface with Si as the implanted dopant.

The remaining i-AlP region sandwiched between p++ and n++ surfaces will separate these highly charged surfaces from tunneling currents while allowing them to remain useful to drive the PV currents, both positive and negative, with minimal leakages. Note in particular that the wide band n-region of AlP, while it does not add to the bandgap of the PV cell, it does effectively block the hole leakages, and results in bringing the $V_{max}$ much closer to $V_{oc}$ instead of settling at 70% of the $V_{oc}$. This allows the PV cell to harvest as much as possible the diffusion-limited hole current from the pn junction, thus providing an enhancement in efficiency up to 40% without involving CQD.

Formation of Charged Quantum Dots

Figure 6:
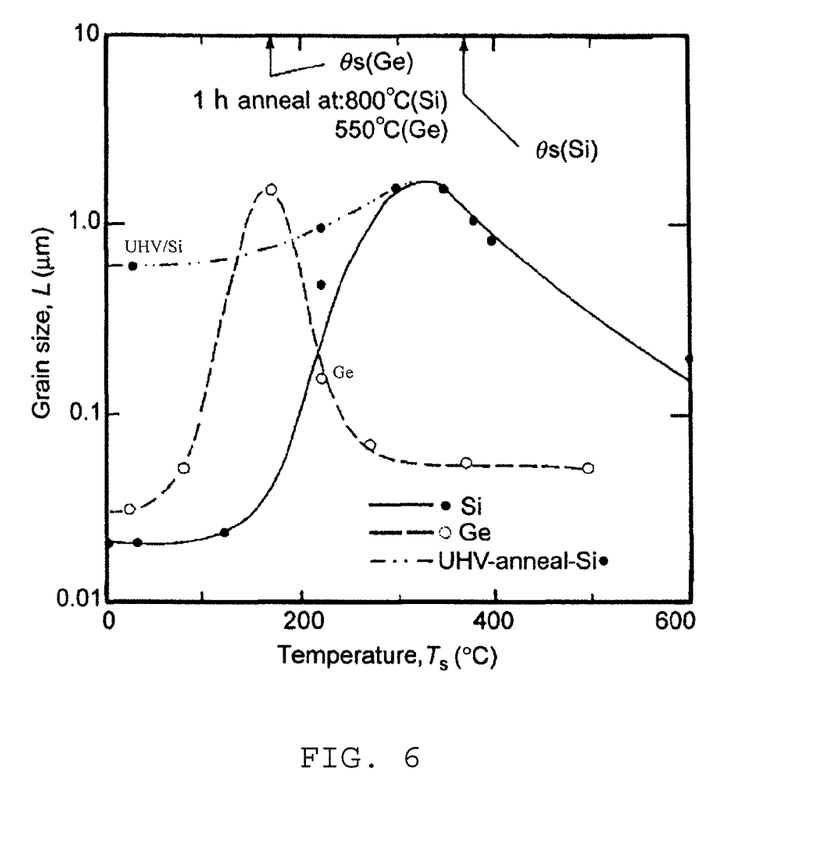
FIG. 6 depicts silicon and germanium quantum dots fabricated on sapphire surface where the surface mobility of the material largely defines the dot size.

FIG. 6 shows the Si and Ge QD fabricated on an $Al_2O_3$ substrate [4]. Note that the substrate material of sapphire and AlP are rather similar with respect to the depositions of Ge and Si, as they allow Ge or Si to move with a relatively high surface mobility over the ceramic-like substrate surfaces to coalesce and form the self-assembled QDs. In addition, the deposition of n++ Si on the n+ AlP surface with Si being the implanted dopant to the i-AlP under PECVD, so that CQD will be linked by a conductive surface beneath to form a quantized charged system where any excessive photo-electrons from IR, for example, would force the system to have the excess electrons into a quantized upper energy state, raise the upper state to the Fermi level and be collected by digital electrodes built on the CQD surface.

For IR photons with energy well beneath the bandgap energy of the pn heterojunction, the photoelectrons generated in the connected CQD system would now simply raise energy of the top electrons to unoccupied energy states and deliver them to the digital electrodes, thus making the CQD the pumping function to facilitate the IR energy to enhance the $J_{sc}$ current independent of the PV function. Note that with an addition of electron current, the necessary hole current to balance the negative charge flows becomes particularly important so that the blocking of hole leakages as shown in FIG. 4B in the wide band heterojunction design becomes vital to the simple but much enhanced high efficiency approach. If the IR pumping increases $J_{sc}$ by 50%, together with $V_{max}$ by 40%, together they would result with more than double the PV efficiency, and thus achieve the goal of overall 40+% in efficiency as indicated in FIG. 3 from the monocrystalline Si-solar cell at ≥20% with minimal additional fabrication cost.

Method of Fabrication

The solar cells described herein can be made at high efficiency with use of p-silicon wafers as the starting substrate, from which a low cost n++ AlP surface can be added upon, followed by annealing and the growth of CQD.

Very thin i-AlP layers can be formed with phosphorous vapor reacting with aluminum foil in an oxygen-free environment. While red phosphorous (red P) is very stable in air, at 300° C. the red P will undergo a phase transition to become white P with vapor pressure, which will react and form a self-limiting compound AlP on the exposed aluminum foil surface. That is, by placing Al foil on the p-Si wafer surface with some red P powder, and moving them into an oven at over 300° C., the red P undergoes a phase transition whose vapor combines with exposed Al to form the i-AlP with the remaining unexposed aluminum beneath, and by increasing the temperature to beyond 660° C., the remaining Al will become molten and merge into the silicon matrix beneath to become its additional p-dopant to form the p++-Si surface as Al has a limited diffusion and remains at a surface layer range in Si. Next, the i-AlP surface will be implanted with Si as an n++ dopant under PECVD followed by a micron thick coating of n+ Si on n++-AlP surface at an elevated annealing T to form CQD as shown in FIG. 6. Since the AlP is a ceramic-like semiconductor stable up to 2,500° C., its surface will readily support the deposition of Si or Ge, whose surface mobility on AlP would allow them to move and coalesce into CQD as indicated in FIG. 6. Using n+ CQD on n++ AlP together with p++ Si surface completes the formation of highly charged surfaces over i-AlP to serve the enhancement function of the PV cell as outlined in FIG. 1.

There is an automated cluster of atomic layer deposition (ALD) chambers available that can be used to evaluate the formation procedures of CQD. The instrument has been developed to fabricate silicon-based wide bandgap materials useful for the construction of high power, high temperature electronic devices [5].

In addition, a high throughput continuous fabrication scheme is also possible with extremely low facility cost. The scheme is described below.

IR pumping by CQD constructed on the single stage p-i-n heterojunction for enhanced PV efficiency could involve three possible systems of CQD, namely, (i) The silicon CQD on n++ AlP substrate surface,
(ii) The germanium CQD on n++ AlP substrate surface, and
(iii) The germanium CQD on annealed n+ Si substrate without AlP.

In connection with the Ge CQD on the annealed Si surface, it is noted that, without involving the use of i-AlP, the addition of n+ (Ge) CQD on the conventional n+ Si surface could have immediate implication to the current low cost Si-based PV cells as well as to the triple junction PV cells using III-V compounds on Ge substrates. Note that the enhanced electron current from the addition of QD must be balanced by the hole current, which is mostly diffusion-limited and highly sensitive to the selection of $V_{max}$. There is evidence in triple junction PV cells that in order to improve on the current flow from the second junction which has been a current bottle neck, the addition of QD there leads to a reduction of $V_{max}$ that is necessary in order to increase the matching hole current in the said junction section, and results without gain of the power output [6]. It is not clear that QD on simple silicon PV cell could develop any gain in power output. Note also that there is a consideration on lattice dimensions between QD material and substrate. As the lattice dimension of Ge is slightly larger than that of silicon, the deposition of Si on the Ge substrate could retain the Ge-based epitaxy for Si by stretching the Si-bonding length to conform to Ge and form the strained Si/Ge superlattice with an enhanced electron mobility of strained Si by 35%, but the potential well of Si or Ge bonds between stretching and compression are not symmetric. While Si bonding length could be stretched to follow the Ge lattice dimension, the Ge bonding length cannot be compressed to follow the Si lattice dimension. As a result, the surface deposition of n+ Ge on Si-surface, particularly on Si <111> surface, allows the Ge atoms to coalesce and form the Ge-based CQD, which will be verified by electron microscopy as well as by the PV efficiency evaluation with respect to the Vmax for the possible gain in power output.

The n++ CQD considered above can also be fabricated on the heterojunction p-i-n surface. Prior to the CQD enhancement, the PV efficiency of the p-i-n photodevice can be demonstrated by comparing with the conventional monocrystalline pn Si-PV cells. Either CQD (Si) or CQD (Ge) can be added to verify their IR pumping functions.

Unlike thin film material for solar cell such as perovskite, a 200 mm monocrystal Si wafer for use in the present invention can be purchased with a minimum thickness of ~200 μ. Thinner wafers, as practiced in chip fabrication for more effective thermal management etc. could be thinned at the back by chemical mechanical operations down to 20 μ after the completion of device fabrication, for example. In such a thinning process, the edge rim of the wafer remains at several hundred μ to help the wafer handling. While un-thinned wafers may be used, thinning of the wafers may be desired to meet the demanding requirement of specific unit weight for space borne applications.

In order to establish the CQD functionalities, one can first construct the monocrystalline p-Si substrate coated with n+ Si or n+ Ge on n++ AlP to be followed by annealing to form the self-assembled CQD made of either Si or Ge.

The construction of silicon solar cells could start with a 200 μ thick boron-doped p-Si wafer before chemical-mechanical thinning to be coated with 2 μ of phosphorous doped n+ Si by PECVD and annealed at 850° C. for a few hours to form epi-Si under dilute H2 in Ar to tie-up dangling bonds from lattice defects. If the epi-n+ surface follows the substrate in <100> structures, it will display a 2×1 reconstructed surface pattern under RHEED (reflection high energy electron diffraction) imaging, or a 7×7 reconstructed image should the surface be <111>. Note that once the 2×1 or 7×7 surface pattern is shown, it implies that the dangling surface bonds are attaching to each other, thus allowing these surface atoms to support a high mobility for elements being deposited upon, element such as Ge that could form n++ CQD at ~190° C. as shown in FIG. 6 for the QD formation on sapphire. It could also form on the Si surface with annealed, closed surface bonds.

Figure 5:
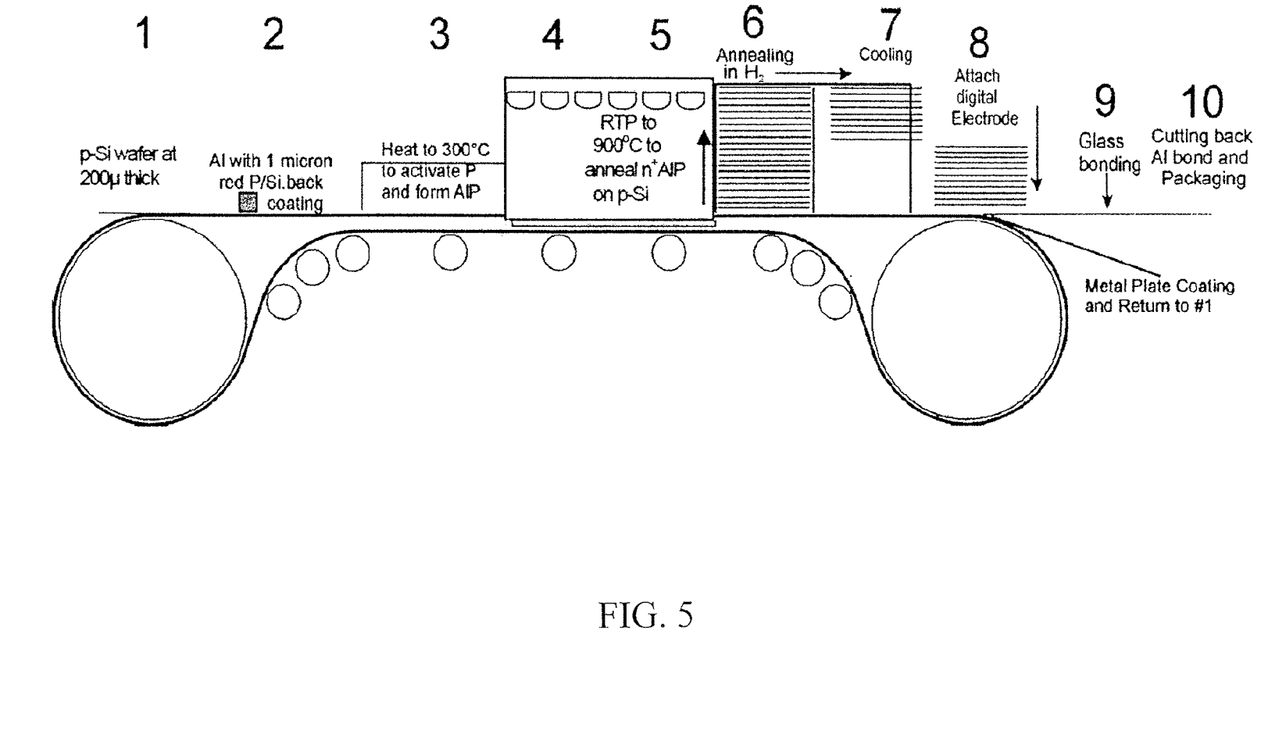
FIG. 5 shows a continuous fabrication tool for fabricating solar PV cells in accordance with a preferred embodiment of the invention.

The fabrication of i-AlP film could start with an Al foil a few μ thick placed on the p-Si-wafer surface together with red phosphorous powder. They will be delivered into an oxygen-free oven. At 300° C. plus, the red P turns into white P with phosphorous vapor, which reacts immediately with the exposed Al surface and forms a The present invention is based in part upon the realization that the lowest cost poly-Si solar cells would have more than ½ of its cost from the poly-Si material, yet more than 90% of the silicon material is wasted during the poly-Si wafer formation by slicing and polishing. Many attempts tried to spray Si in its molten state to form the poly-Si wafers without slicing and polishing and without success, due mainly to the lack of a proper receiving substrate material at low cost. With a low cost ceramic-like AlP that is stable up to 2,5000° C. which can be formed at low has solved the difficulty, as molten Si can be spray-formed upon and thereby reduce the fabrication cost of poly-Si solar cells by ½. Next, one must consider the hydroscopic nature of the AlP material and most important, the quantum efficiency of the AlP/Si PV cells. The addition of CQD for space-borne PV cells provides a perfect match for a continuous fabrication scheme designed for very high throughput, including the consideration of annealing at an elevated temperature and the subsequent cooling time, as shown in FIG. 5.

Fine graphite powder can be added on the i-AlP surface to reduce surface reflectivity. A subsequent formation of n+ CQD on the n++ AlP surface will complete the formation of two highly charged surfaces separated by the i-AlP as indicated in FIG. 1.

Figure 7:
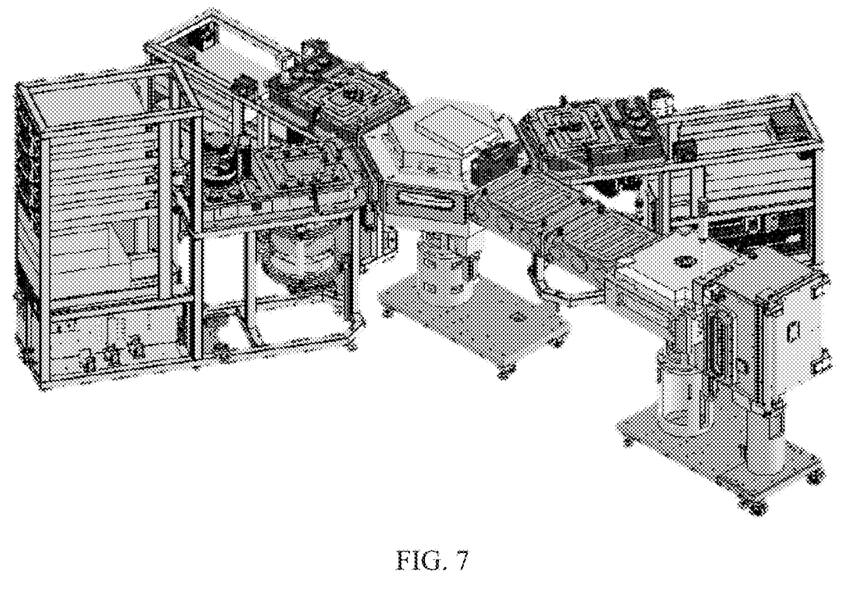
FIG. 7 depicts an automated cluster of atomic vapor deposition (ALD) chambers that can be used to process different functions in CQD fabrication.

Fabrication instruments developed for Si/C super lattice project of NanoDynamics-88, Inc. of New York, N.Y., include several generations of atomic vapor deposition (ALD) chambers, with each generation obtaining a higher throughput and an improved automation. FIG. 7 shows a highly automated cluster of several ALDs where 500 mm wafers can be transported from one ALD to another in order to process different fabrication functions that can be utilized for the CQD fabrication.

The cluster of linked ALDs shown in FIG. 7 has a feed station where 500 mm wafers are housed in chambers-containing up to 25 wafers each that can be sent to different ALD stations for different gaseous depositions under different temperatures. Each ALD can be maintained with a vacuum level of 10-8 torr, not nearly as high as MBE, but the chambers can be purged with inert gas to reduce potential contamination. Up to 5 ALDs can function in this system, or 125 500 mm wafers can be processed sequentially or in parallel. That is, the incorporation of CQD can be conducted in the ALD cluster system as part of the continuous fabrication tool to be described next.

Figure 8:
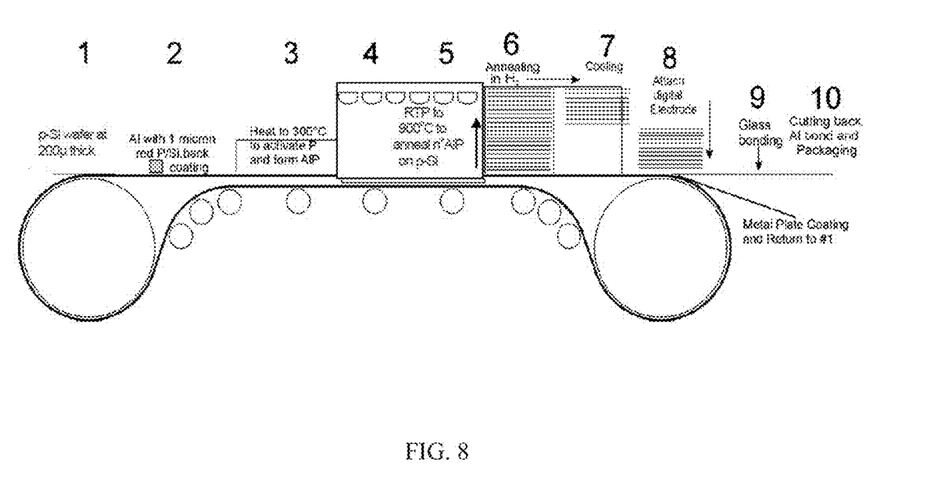

The present invention is based in part upon the realization that the lowest cost poly-Si solar cells would have more than ½ of its cost from the poly-Si material, yet more than 90% of the silicon material is wasted during the poly-Si wafer formation by slicing and polishing. Many attempts tried to spray Si in its molten state to form the poly-Si wafers without slicing and polishing and without success, due mainly to the lack of a proper receiving substrate material at low cost. With a low cost ceramic-like AlP that is stable up to 2,500° C. which can be formed at low has solved the difficulty, as molten Si can be spray-formed upon and thereby reduce the fabrication cost of poly-Si solar cells by ½. Next, one must consider the hydroscopic nature of the AlP material and most important, the quantum efficiency of the AlP/Si PV cells. The addition of CQD for space-borne PV cells provides a perfect match for a continuous fabrication scheme designed for very high throughput, including the consideration of annealing at an elevated temperature and the subsequent cooling time, as shown in FIG. 8.

Instead of spray-forming the molten silicon on the AlP surface, one can use a thin, 500 mm monocrystalline p-Si wafer covered by an Al foil and red phosphorous powder sitting on a SiC coated graphite tray to start the fabrication process. As the wafer tray enters an oxygen-free oven at ≥300° C., the red P undergoes a phase transition to white P with P vapor reacting with an exposed Al-surface and forming self-liming i-AlP with p-Si wafer beneath. Further heating melts the remaining aluminum unexposed to P which merges into the silicon matrix beneath and becomes an additional p-dopant to form a p++ surface as Al has a limited diffusion length in the Si-matrix. The wide band n-region of AlP would block the hole leakages, as shown in FIG. 4B, and allow the Vmax≈Voc.

The time-consuming annealing at an elevated temperature and its subsequent cooling can be conducted in vertical columns in order to avoid slowing down the high throughput process. After annealing, the i-AlP with $p^{++}$ Si-surface beneath could receive a shallow implant of Si as the $n^{++}$ dopant to form the needed $n^{++}$ surface on i-AlP in order to support the formation of CQD for IR photoelectron harvesting. The fabrication tool shown in FIG. 5 depicts the following features of the invention:

Station 1. 200 mm p-silicon wafers at 500 μ thick covered with an aluminum foil of 4 μ thick can be placed Station 2. Graphic powder mixed with red phosphorous can be added.

Station 3. First Heating Chamber. The wafer can enter an oxygen free chamber at 300+° C. where the red phosphorous will undergo a phase transition to become white phosphorous with vapor pressure that reacts with the aluminum foil beneath to form AlP which is stable up to 2,500° C.

Station 4, 5. Rapid Thermal Pulse (RTP) raises the surface of Si wafer to nearly 900° C. and melts the remaining Al into the p-Si substrate to become the additional p-dopant while allowing the self-limiting layer of AlP to firmly attach to the p-Si.

Station 6. Annealing Chamber maintained at 900° C. Since the annealing activities, even at 900° C., will need some time to conclude, the wafer can enter a vertical motion, ascending one by one and transfer at top to Chamber 6 for cooling.

Station 7,8. The Cooling Chamber. Wafers cool from 900° C. to ambient temperature can pass through all needed temperature regions to complete the remaining fabrication steps that include Formation of CQD
Attachment of Digital Electrode (Preprinted On a Waxy Paper Surface)
Bonding with Protective Glass Surface if necessary
Bonding with Aluminum Back for reflection and as the Positive Electrode The fabrication system with continuous flow could produce more than 0.1 megawatts per year at very low facility cost. The system can be integrated with the ALD cluster as described above for CQD fabrication, for example.

On the low cost commercial scale manufacturing of solar cells outlined above, the p-substrate material of silicon could readily be modified from a flat surface to certain non-flat contour in order to mount on or integrate with ground vehicles or unmanned airborne vehicles. While organic molecules such as pentacene [11] can provide singlet exciton at 2.83 eV and triplet exciton at 0.85 eV, which are bandgap energies similar to the expensive III-V multifunction PV cells fabricated on the Ge substrate. For realistic deployment, the biomolecule must be protected from the environment and sealed by a glass surface, for example. The described AlP compound could also conform to virtually any geometry and is stable up to 2,500° C. That is, the low cost AlP can readily support a spray-coating procedure of molten silicon to form a p-layer with a thickness of 100 μ, for example, followed by an annealing of 900° C. in $H_2$ and can similarly be coated with $n^+$ CQD on the $n^{++}$ AlP surface to result with a similar high efficiency PV structure:

$$n^+CQD-n^{++}AlP-iAlP-p^{++}Si-p-Si$$

Such an inexpensive thin PV can be similarly sealed with glass to prevent AlP becoming hydroscopic from moisture with the needed contour and protect against all environmental elements absent from space. With the spray-coating of poly-Si formed on the AlP, the PV efficiency could become reduced as much as ⅓ from the proposed monocrystalline wafer Si, and if the spray-coated low cost PV cell could still reach an efficiency of 25-30%, it remains to be a highly viable commercial product. Note that the spray-coating apparatus could simply be an induction-heated high T nozzle under pressure to melt the Si and spray it like an automobile painting, although the low cost manufacturing for non-flat surface is not required for space-borne applications.

EXAMPLES

The following tasks may be carried out to form and evaluate a solar cell in accordance with the invention described herein.

Task 1. Fabrication of Monocrystalline Si PV Cells 200 mm p-Si wafer at 40-60 μ with Boron dopant can be covered with one μ of $n^+$ Si layer by PECVD with phosphorus dopant and annealed with $H_2$ gas at 900° C. to form an epi-Si PV cell.

Task 2. Formation of $n^{++}$ AlP/$p^{++}$-Si

Al foil at 4 μ thick can be placed on the 200 mm p-Si wafer surface and placed in an oven with P vapor at 300° C. to form the self-liming i-AlP. The remaining Al from the self-limiting i-AlP will merge into the p-Si at an elevated temperature beyond 660° C. and become an additional p-dopant for the p-Si to form $p^{++}$-Si surface, and shallowly implanting Si on i-AlP to replace Al in AlP becoming the n-dopant for the $n^{++}$-AlP surface.

Task 3. Simulated Solar Radiation Spectrum and PV Efficiency Evaluations

A commercial light source of stimulated solar radiation spectrum can be used and illuminated without concentrator on the monocrystalline Si solar cell as well as the AlP/Si heterojunction solar cell to establish their respective PV efficiency without CQD.

Task 4. Construction of Si-CQD on $n^+$ AlP

Si can be implanted into the i-AlP to form $n^{++}$-AlP surface at a range of temperatures followed by deposition of $n^+$ Si to form CQD as indicated by FIG. 6 for various CQD sizes as verified by optical microscopy and illuminated with simulated solar radiation for enhanced PV efficiencies.

Task 5. Construction of Ge-CQD

One μ of Ge will be deposited on the $n^+$ Si/p-Si surface or the $n^{++}$ AlP/p-Si surface using ALD to form Ge-CQD as indicated in FIG. 6.

Task 6. Evaluation of Efficiency

The PV efficiency of monocrystalline Si PV cells and $n^{++}$ AlP/p-Si PV cells can be compared.

Ge-CQD on Si-PV cells and on AlP/Si PV cells can be compared with Si-CQD on AlP/Si PV cells by using the commercial simulated solar radiation without concentrator.

The invention claimed is:

1. A photovoltaic (PV) device comprising:
   (a) a p-n junction comprising (i) a boron-doped p-type silicon substrate comprising an Al-doped P++ surface, (ii) an intrinsic AlP region having a first side formed on the Al-doped P++ surface of the silicon substrate, and (iii) an Si-doped N++ surface formed on a second side of the intrinsic AlP region that is opposite to the first side;
   (b) charged quantum dots formed on the Si-doped N++ surface of the p-n junction; and
   (c) an electrode connected to each side of the device;
wherein the charged quantum dots are operatively linked to the p-n junction to enable electrons harvested from IR photons absorbed by the quantum dots to be harvested with electrons harvested from photons absorbed by the p-n junction; and wherein the intrinsic AlP region is configured to inhibit leakage of hole current, wherein the Al-doped P++ surface is formed by melting aluminum into the boron-doped p-type silicon substrate such that the Al-doped P++ surface is more heavily doped than the boron-doped p-type silicon substrate and is effective to drive hole current in the PV device, and wherein the intrinsic AlP region with Si-doped N++ surface on the second side thereof is effective to block hole leakages.

\* \* \* \* \*